United States Patent
Matsukawa et al.

(10) Patent No.: US 11,276,631 B2
(45) Date of Patent: Mar. 15, 2022

(54) MODULE AND METHOD OF MANUFACTURING MODULE

(71) Applicant: Murata Manufacturing Co., Ltd., Kyoto (JP)

(72) Inventors: Yoshitaka Matsukawa, Kyoto (JP); Akio Katsube, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 71 days.

(21) Appl. No.: 16/716,647

(22) Filed: Dec. 17, 2019

(65) Prior Publication Data

US 2020/0118913 A1   Apr. 16, 2020

Related U.S. Application Data

(63) Continuation of application No. PCT/JP2018/022700, filed on Jun. 14, 2018.

(30) Foreign Application Priority Data

Jun. 20, 2017   (JP) .............................. JP2017-120160

(51) Int. Cl.
*H01L 23/52* (2006.01)
*H01L 23/498* (2006.01)
(Continued)

(52) U.S. Cl.
CPC .... *H01L 23/49816* (2013.01); *H01L 21/4853* (2013.01); *H01L 23/3128* (2013.01);
(Continued)

(58) Field of Classification Search
CPC ........... H01L 21/4853; H01L 23/49816; H01L 23/3128; H01L 23/552; H01L 24/16; H01L 24/81; H01L 25/16
(Continued)

(56) References Cited

U.S. PATENT DOCUMENTS

| 9,230,876 B2 * | 1/2016 | Lee | .................... H01L 23/5389 |
| 9,324,657 B2 * | 4/2016 | Seo | .................... H01L 23/5384 |

(Continued)

FOREIGN PATENT DOCUMENTS

| JP | 2000-040868 A | 2/2000 |
| JP | 4626008 B2 | 2/2011 |

(Continued)

OTHER PUBLICATIONS

International Search Report for International Application No. PCT/JP2018/022700 dated Sep. 4, 2018.
(Continued)

*Primary Examiner* — Luan C Thai
(74) *Attorney, Agent, or Firm* — Pearne & Gordon LLP

(57) ABSTRACT

A module includes a substrate, a plurality of components on an upper surface of the substrate, a component on a lower surface of the substrate, solder balls on the lower surface, sealing resin layers stacked on the upper surface and the lower surface of the substrate, and a shield film covering a side surface and an upper surface of the module. Part of each solder ball is exposed from a surface of the sealing resin layer, and the exposed parts are shaped to protrude from the sealing resin layer. The module can be connected to a mother substrate by connecting the protruding parts of the solder balls. There are gaps between the solder balls and the sealing resin layer, and the occurrence of cracks in the solder balls can be suppressed by reducing stress arising from a difference in thermal expansion coefficient between the solder and the resin.

14 Claims, 6 Drawing Sheets

(51) Int. Cl.
  *H01L 21/48* (2006.01)
  *H01L 23/31* (2006.01)
  *H01L 23/552* (2006.01)
  *H01L 23/00* (2006.01)
  *H01L 25/16* (2006.01)

(52) U.S. Cl.
  CPC ............ *H01L 23/552* (2013.01); *H01L 24/16* (2013.01); *H01L 24/81* (2013.01); *H01L 25/16* (2013.01); *H01L 2224/16227* (2013.01); *H01L 2224/81815* (2013.01); *H01L 2224/81947* (2013.01); *H01L 2224/81948* (2013.01); *H01L 2924/19102* (2013.01); *H01L 2924/3025* (2013.01); *H01L 2924/351* (2013.01)

(58) Field of Classification Search
  USPC .................. 257/737, 738, 778; 438/106, 666
  See application file for complete search history.

(56) References Cited

U.S. PATENT DOCUMENTS

| | | | |
|---|---|---|---|
| 9,385,109 B2* | 7/2016 | Kim | H01L 25/50 |
| 9,390,992 B2* | 7/2016 | Kwon | H01L 25/0657 |
| 9,559,064 B2* | 1/2017 | Chen | H01L 21/4867 |
| 9,613,933 B2* | 4/2017 | De Bonis | H01L 24/17 |
| 10,256,173 B2* | 4/2019 | Wu | H01L 23/15 |
| 2001/0002728 A1 | 6/2001 | Tsukada et al. | |
| 2010/0072600 A1* | 3/2010 | Gerber | H01L 25/105 257/686 |

FOREIGN PATENT DOCUMENTS

| | | | |
|---|---|---|---|
| JP | 2015-216219 A | | 12/2015 |
| KR | 10-2010-0113676 A | | 10/2010 |
| KR | 10-2017-0055937 A | | 5/2017 |

OTHER PUBLICATIONS

Written Opinion for International Application No. PCT/JP2018/022700 dated Sep. 4, 2018.
Notification of Preliminary Rejection for KR Patent Application No. 10-2019-7033134 dated Mar. 23, 2021.

* cited by examiner

MODULE AND METHOD OF MANUFACTURING MODULE

This is a continuation of International Application No. PCT/JP2018/022700 filed on Jun. 14, 2018 which claims priority from Japanese Patent Application No. 2017-120160 filed on Jun. 20, 2017. The contents of these applications are incorporated herein by reference in their entireties.

BACKGROUND

Technical Field

The present disclosure relates to a module and to a method of manufacturing a module.

Heretofore, a technique of forming external connection terminals by arranging substantially spherical electrically conductive support columns on a substrate has been known. For example, as illustrated in FIG. 7, a module 100 disclosed in Patent Document 1 is configured such that a substantially spherical electrically conductive ball 105, which is electrically connected to an electrode pad 102 via a wiring line 104, is formed on a semiconductor chip 103, which is equipped with the electrode pad 102 which is formed on a main surface of a semiconductor substrate 101. A resin layer 106 is formed on the semiconductor chip 103 such that a top part of the electrically conductive ball 105 is exposed, and an external connection terminal 107 composed of solder is provided on the top part of the electrically conductive ball 105, which is exposed from the resin layer 106. In the thus-configured module 100, a support column, which is for connecting the wiring line 104 and the external connection terminal 107 to each other, can be formed inside the resin layer 106 by arranging the electrically conductive ball 105 at a prescribed position on the wiring line 104 and thus a support column having a desired height can be formed in a very short period of time compared with the case where a support column is formed using a plating method.

Patent Document 1: Japanese Patent No. 4626008 (refer to paragraphs 0023-0025, FIG. 6, etc.)

BRIEF SUMMARY

However, in the case where the external connection terminal 107 is provided on the top part of the electrically conductive ball 105 as described in Patent Document 1, there is a problem in that reliability and mechanical strength are degraded due to the connecting portion between the electrically conductive ball 105 and the external connection terminal 107 having a constricted shape when the module is mounted on a mother substrate. In addition, there is a problem in that the top part of the electrically conductive ball 105 is flush with the resin layer 106 and it is necessary to provide the external connection terminal 107 composed of a solder ball as a bump when connecting the module to a mother substrate and therefore the number of manufacturing steps is increased and there is a problem that it is difficult to realize a reduction in height due to the external connection terminal 107 composed of a solder ball being placed on the resin layer 106.

The present disclosure provides a module having improved reliability and mechanical strength by forming external connection terminals not having a constricted shape using solder balls.

The present disclosure provides a module that includes: a substrate; a connection electrode that is provided on one main surface of the substrate; a first component that is mounted on the one main surface of the substrate; an external connection terminal that is composed of a solder ball and is disposed on the one main surface of the substrate with the connection electrode interposed therebetween; and a sealing resin layer that is provided on the one main surface of the substrate and seals the one main surface of the substrate and the first component. Part of the external connection terminal is exposed from an opposite surface of the sealing resin layer that is on an opposite side from a facing surface of the sealing resin layer that faces the one main surface of the substrate, a height of the external connection terminal from the one main surface of the substrate is larger than a height of the sealing resin layer from the one main surface of the substrate, there is a gap between the external connection terminal and the sealing resin layer, and a facing surface of the sealing resin layer, which surrounds the external connection terminal, that faces the external connection terminal is a curved surface that forms a curved line in a cross section perpendicular to the one main surface of the substrate.

With this configuration, the external connection terminal is formed of a solder ball and has a shape that is not constricted, and therefore the mechanical strength and reliability of the external connection terminal can be improved. In addition, since the external connection terminal is formed of solder, high positional accuracy can be realized for the external connection terminal due to a self-alignment effect that occurs when a reflow process is performed. Furthermore, since the solder ball has a shape so as to be exposed and protrude from the sealing resin layer, there is no need to perform plating on a terminal part and the manufacturing cost can be suppressed.

In addition, the load corresponding to stress acting in a horizontal direction in the substrate is dispersed due to the facing surface of the sealing resin layer, which surrounds the external connection terminal, that faces the external connection terminal being a curved surface that forms a curved line in a cross section perpendicular to the one main surface of the substrate compared with the case where the facing surface is a curved surface forms a straight line in the cross section, and therefore the occurrence of peeling off can be suppressed.

In addition, the external connection terminal may be formed of one solder ball. In this case, since the solder ball has a shape that is round and protrudes from the sealing resin layer, the solder ball can be used as it is as a bump when mounting the module on a mother substrate.

In addition, the external connection terminal and the sealing resin layer may not touch each other at all. In other words, the external connection terminal is not in direct contact with the sealing resin layer. In this case, due to the solder ball and the sealing resin layer not touching each other, stress arising from a difference in thermal expansion coefficient between the solder and the resin can be reduced and the occurrence of cracks in the solder ball can be suppressed.

Furthermore, part of the first component may be exposed from the opposite surface of the sealing resin layer. In this case, a low profile can be realized for the module.

A surface of the first component that is exposed from the opposite surface of the sealing resin layer may be flush with the opposite surface of the sealing resin layer. In this case, a low profile can be realized for the module.

In addition, a second component may be mounted on another main surface of the substrate. In this case, the mounting area can be increased by also mounting components on the other main surface of the substrate and freedom of design can be improved.

In addition, the present disclosure provides a method of manufacturing a module, the method including: a step of mounting a component and a solder ball on mounting electrodes on one main surface of a substrate; a step of heating the substrate in a reflow furnace and fixing the component and the solder ball to the substrate; a step of stacking a sealing resin layer that seals the component and the solder ball on the one main surface of the substrate; a step of performing grinding on part of the solder ball and an opposite surface of the sealing resin layer that is on an opposite side from a facing surface of the sealing resin layer that faces the one main surface so that the solder ball is exposed from the opposite surface of the sealing resin layer, and a step of reheating the substrate in a reflow furnace so that a height of the solder ball from the one main surface of the substrate becomes larger than a height of the sealing resin layer from the one main surface of the substrate.

In this case, when the solder ball is exposed by subjecting the sealing resin layer to grinding and a heat treatment is then performed in a reflow furnace, the solder ball changes into a spherical shape and protrudes from the ground surface of the sealing resin layer due to the surface tension and the solder ball can be used as a bump. Therefore, there is no need to form a bump for connecting the module to a mother substrate once more. In addition, since the solder ball is mounted as an external connection terminal, there is no need to perform plating and therefore abnormal precipitation of plating does not occur, and a module having high reliability and mechanical strength can be manufactured.

According to the present disclosure, a module having high reliability and mechanical strength can be provided and a low profile can be realized for the module.

DETAILED DESCRIPTION

Figure 1:
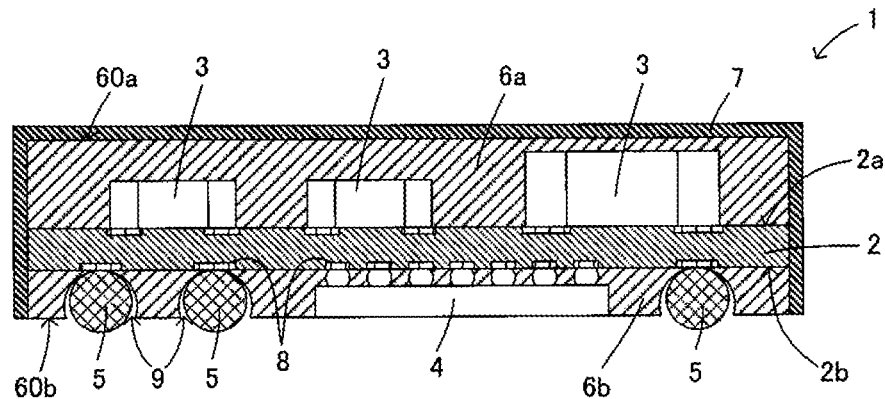
FIG. 1 is a sectional view of a module according to an embodiment of the present disclosure.

A module 1 according to an embodiment of the present disclosure will be described while referring to FIGS. 1 and 2. FIG. 1 is a sectional view of the module 1 and FIGS. 2A-2C are enlarged sectional views illustrating examples of methods of mounting a solder ball of the module 1.

As illustrated in FIG. 1, the module 1 according to this embodiment includes: a substrate 2; a plurality of components 3 that are mounted on an upper surface 2a of the substrate 2; a component 4 that is mounted on a lower surface 2b of the substrate 2; a plurality of solder balls 5 that are mounted on the lower surface 2b and serve as external connection terminals; sealing resin layers 6a and 6b that are stacked on the upper surface 2a and the lower surface 2b of the substrate 2 and seal the substrate 2, the components 3, and the component 4; and a shield film 7 that covers a side surface and an upper surface of the module 1. The module 1 is mounted on a mother substrate (not illustrated) via the solder balls 5.

The substrate 2 is for example formed of a low-temperature co-fired ceramic, a glass epoxy resin, or the like and via conductors (not illustrated) and various wiring electrodes (not illustrated) are formed inside the substrate 2. In addition, connection electrodes 8, which are for providing connections to the plurality of components 3, the component 4, and the solder balls 5, are formed on the upper surface 2a and the lower surface 2b of the substrate 2. The substrate 2 may have a single layer structure or a multilayer structure.

The components 3 (corresponding to a "second component" of the present disclosure) for example consist of semiconductor elements formed of Si and so forth and electronic components such as chip capacitors, chip inductors, chip resistors, chip antennas, and so forth. The components 3 are sealed by the sealing resin layer 6a.

The component 4 (corresponding to a "first component" of the present disclosure) is a semiconductor component such as a semiconductor element formed of Si and so forth and is mounted on the lower surface 2b of the substrate 2. The component 4 is sealed by the sealing resin layer 6b, but part of the component 4 may be exposed from a surface 60b of the sealing resin layer 6b (corresponding to an "opposite surface that is on an opposite side from a facing surface that faces the one main surface" of the present disclosure).

The solder balls 5 are mounted on the lower surface 2b (corresponding to "one main surface" of the present disclosure) of the substrate 2 and are connected to the connection electrodes 8 on the lower surface 2b. Furthermore, part of each solder ball 5 is exposed and protrudes from the surface 60b of the sealing resin layer 6b and the parts of the solder balls 5 that are exposed from the surface 60b of the sealing resin layer 6b function as external connection terminals when the module 1 is mounted on a mother substrate. In other words, the heights of the solder balls 5 from the lower surface 2b of the substrate 2 are larger than the height of the sealing resin layer 6b from the lower surface 2b of the substrate 2 and part of each solder ball 5 is shaped so as to protrude from the surface 60b of the sealing resin layer 6b. The module 1 can be connected to the mother substrate by connecting the protruding parts of the solder balls 5 serving as bumps to electrodes on the mother substrate. Furthermore, there are gaps 9 (corresponding to "gaps" of the present disclosure) between the solder balls 5 and the sealing resin layer 6b. In other words, there are places where the solder balls 5 and the sealing resin layer 6b do not contact each other.

Figure 2A:
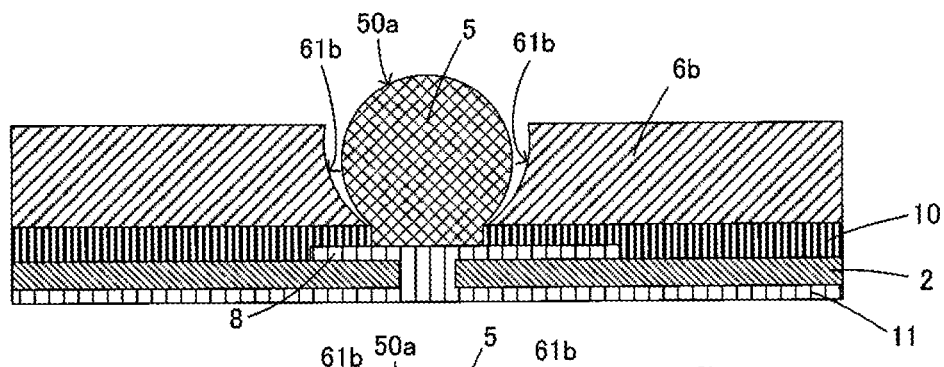
FIGS. 2A-2C are enlarged sectional views illustrating an example of a method of mounting a solder ball of the module in FIG. 1.
Figure 2B:
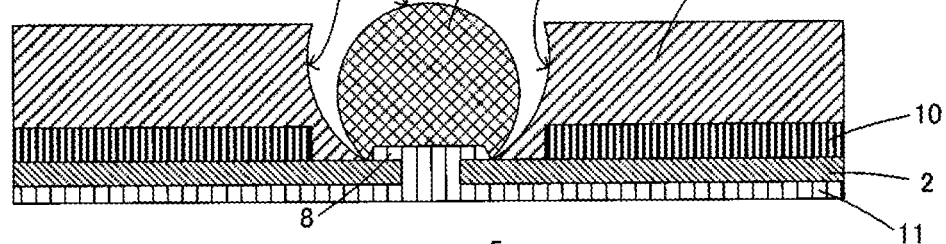
Figure 2C:
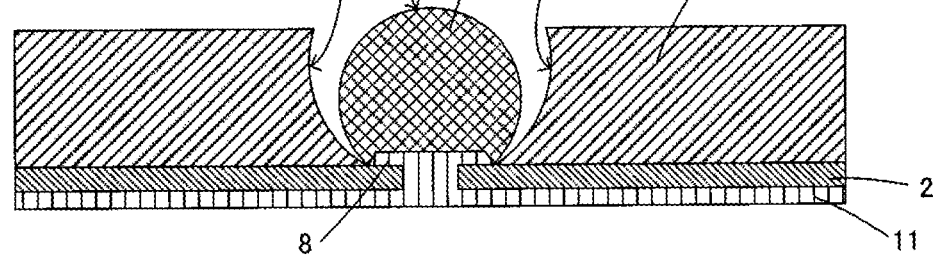

In addition, methods of mounting the solder balls 5 may include, for example, using an over resist structure in which peripheral portions of the connection electrodes 8 are covered by a solder resist 10 as illustrated in FIG. 2A, a clearance structure in which there is a clearance between the connection electrodes 8 and the solder resist 10, i.e., the connection electrodes 8 and the solder resist 10 do not contact each other as illustrated in FIG. 2B, and the structure illustrated in FIG. 2C. In addition, as illustrated in FIGS. 2A to 2C, the connection electrodes 8 are electrically connected to a wiring layer 11. In addition, a facing surface 61b of the sealing resin layer that faces an outer peripheral surface 50a of each solder ball 5 is a curved surface that forms a curve in a cross section perpendicular to the lower surface 2b of the substrate 2. In other words, the facing surface 61b is shaped like part of a spherical body has been cut away from the sealing resin layer 6b.

The sealing resin layer 6a is provided on the upper surface 2a of the substrate 2 so as to cover the upper surface 2a of the substrate 2 and the components 3. In addition, the sealing resin layer 6b is provided on the lower surface 2b of the substrate 2 so as to cover the lower surface 2b of the substrate 2 and the component 4. In addition, as illustrated in FIGS. 2(a) to 2(c), the solder balls 5 are surrounded by the sealing resin layer 6b. The sealing resin layers 6a and 6b can be formed of a resin that is typically employed as a sealing resin such as an epoxy resin containing silica filler. In addition, alumina filler can also be used in order to increase thermal conduction.

The shield film 7 is for shielding the various electrodes inside the substrate 2 and the components 3 and 4 from electromagnetic waves from the outside and is arranged so as to cover the side surface and the upper surface (surface 60a of sealing resin layer 6a) of the module 1. In addition, the shield film 7 can be formed so as to have a multilayer structure including an adhesive film, an electrically conductive film that is stacked on the adhesive film, and a protective film that is stacked on the electrically conductive film.

(Method of Manufacturing Module)

Next, an example of a method of manufacturing the module 1 of the present disclosure will be described while referring to FIGS. 3 and 4.

Figure 3A:
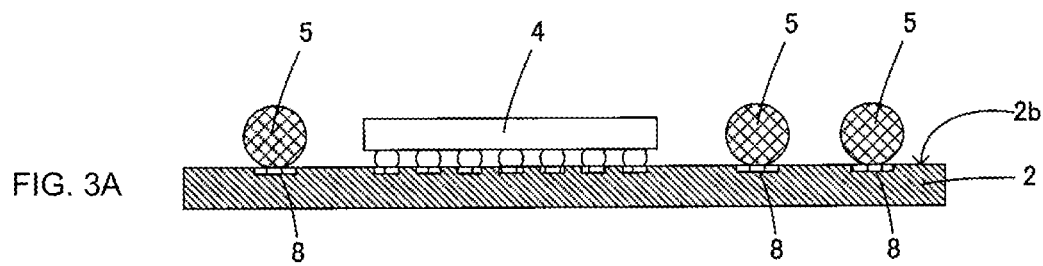
FIGS. 3A-3E are diagrams illustrating steps of manufacturing the module in FIG. 1.

First, as illustrated in FIG. 3A, the substrate 2, which is able to have components mounted on the upper surface 2a and the lower surface 2b thereof, is prepared, the connection electrodes 8 are formed via printing by applying a solder paste to the lower surface 2b of the substrate 2, and the component 4 and the solder balls 5 are mounted thereon. Instead of mounting the solder balls 5, the solder balls 5 may be formed by using a technique in which the amount of solder paste that is applied is increased and then the solder paste is heated using a reflow furnace so that the solder paste becomes ball-shaped. Next, the substrate 2 is placed into a reflow furnace and a heat treatment is performed, and the component 4 and the solder balls 5 are fixed to the lower surface 2b of the substrate 2. Flux washing may be performed after the heat treatment in the reflow furnace.

Figure 3B:
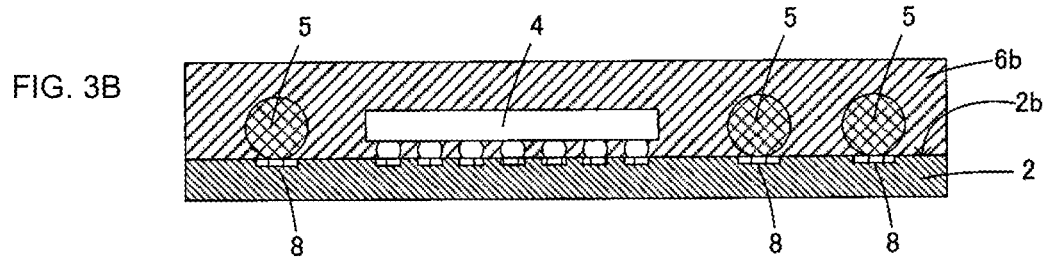

Next, as illustrated in FIG. 3B, the sealing resin layer 6b is stacked on the lower surface 2b of the substrate 2 so as to cover the component 4 and the solder balls 5.

Figure 3C:
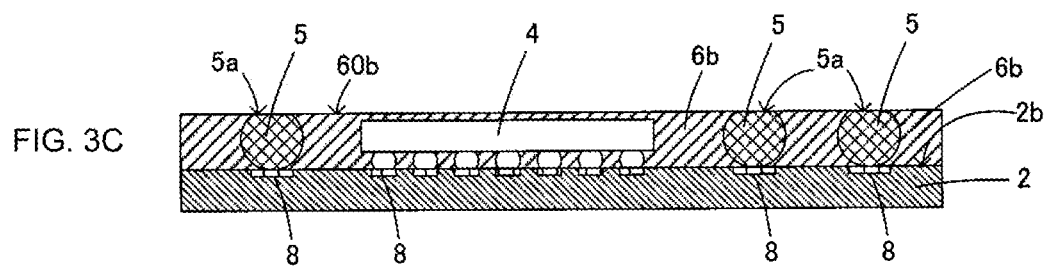

Next, as illustrated in FIG. 3C, the surface 60b of the sealing resin layer 6b is subjected to grinding until the solder balls 5 are exposed. At this time, the amount of grinding that the sealing resin layer 6b is subjected to is adjusted so that components other than the solder balls 5 do not become exposed. The height of the sealing resin layer 6b may be adjusted so that part of the component 4 is exposed from the surface 60b of the sealing resin layer 6b.

Figure 3D:
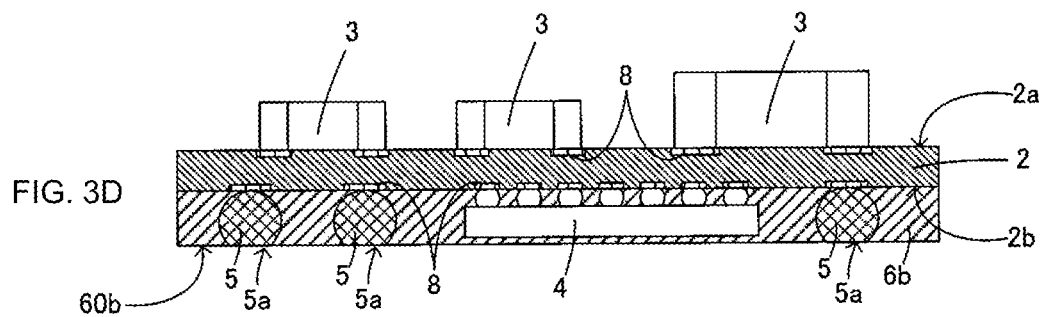

Next, as illustrated in FIG. 3D, the connection electrodes 8 are formed via printing by applying solder paste to the upper surface 2a of the substrate 2 and the components 3 are mounted thereon. After that, flux is applied to exposed surfaces 5a of the solder balls 5 at the surface 60b of the sealing resin layer 6b and a heat treatment is performed in a reflow furnace. Flux washing may be performed after the heat treatment in the reflow furnace.

Figure 3E:
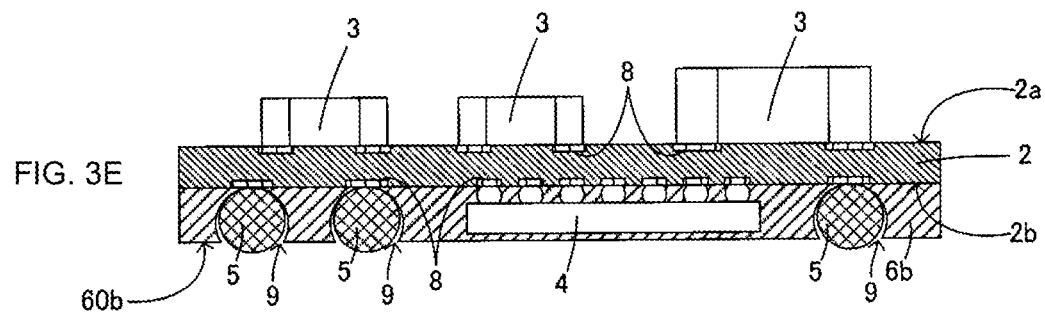

When the heat treatment is performed in a reflow furnace, as illustrated in FIG. 3E, the components 3 are fixed to the substrate 2 and the solder balls 5 come to be shaped so as to protrude from the surface 60b of the sealing resin layer 6b due to the surface tension of the solder.

Figure 4A:
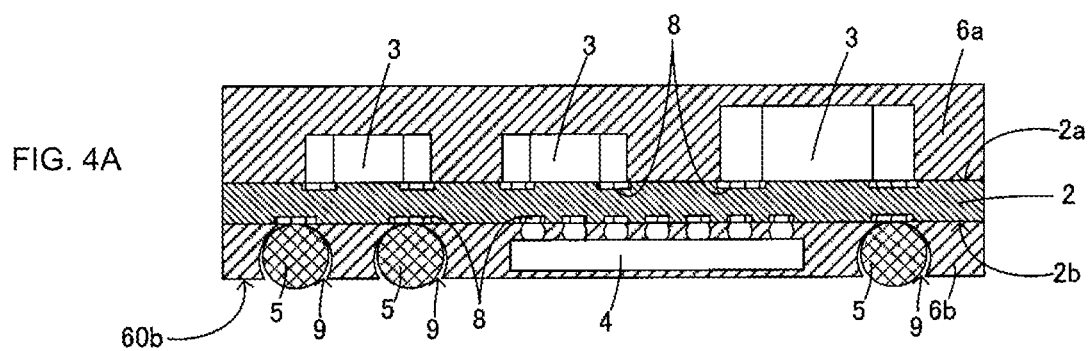
FIGS. 4A and 4B are diagrams illustrating steps of manufacturing the module in FIG. 1.

Next, as illustrated in FIG. 4A, the sealing resin layer 6a is stacked on the upper surface 2a of the substrate 2 so as to cover the components 3.

Figure 4B:
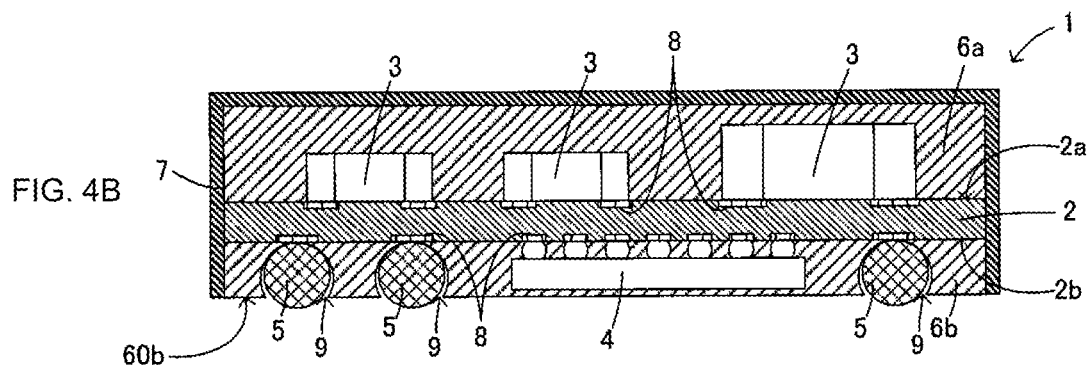

After that, as illustrated in FIG. 4B, the module 1 is completed by applying the shield film 7 using a sputtering device or a vacuum deposition device.

After the components 3 have been mounted on the upper surface 2a of the substrate 2 and the components 3 have been fixed to the substrate 2 by performing the heat treatment in the reflow furnace, the surface 60b of the sealing resin layer 6b may be subjected to grinding, flux may be applied to the exposed surfaces 5a, and a heat treatment may be performed once more in the reflow furnace.

Here, the series of steps from grinding of the surface 60b of the module 1 up to mounting of the module 1 on a mother substrate will be described while referring to FIGS. 5A-5C. The shield film 7 is not illustrated in FIGS. 5A-5C.

Figure 5A:
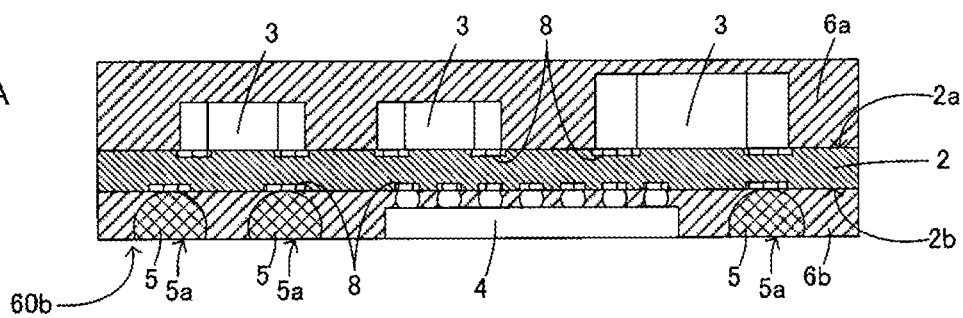
FIGS. 5A-5C are diagrams illustrating a step of mounting the module in FIG. 1 on a mother substrate.
Figure 5B:
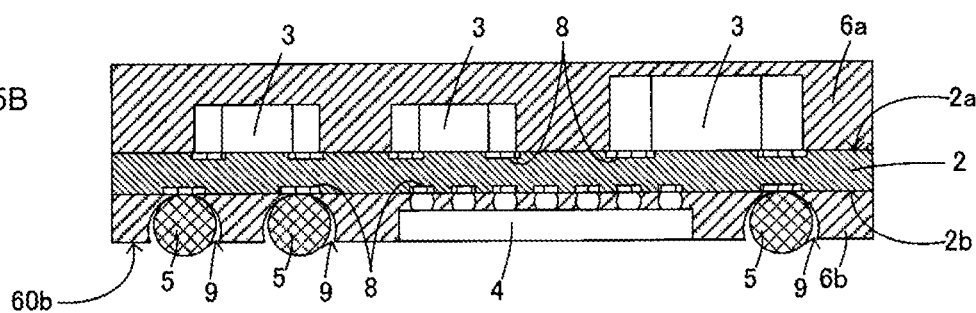
Figure 5C:
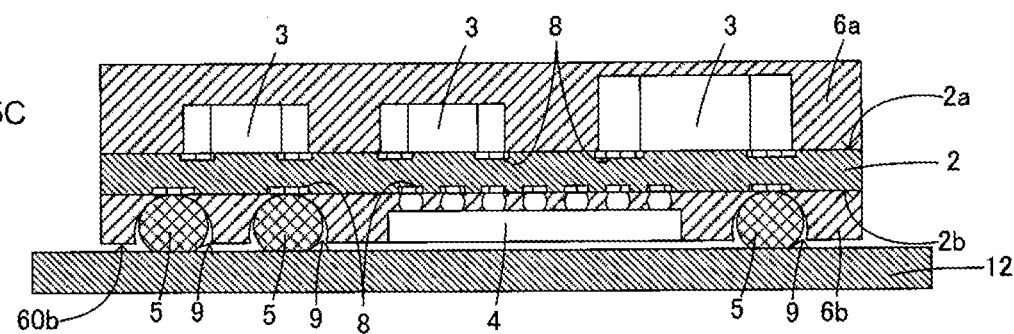

FIG. 5A is a diagram illustrating a state that exists after the solder balls 5 have been exposed from the surface 60b of the sealing resin layer 6b by grinding the surface 60b of the sealing resin layer 6b. At this time, the surface 60b of the sealing resin layer 6b and the exposed surfaces 5a of the solder balls 5 are formed so as to be flush with each other. When flux is applied to the exposed surfaces 5a of the solder balls 5 and a heat treatment is performed in a reflow furnace, as illustrated in FIG. 5B, the solder balls 5 come to have a substantially spherical shape and are shaped so as to protrude from the surface 60b of the sealing resin layer 6b. At this time, the gaps 9, which are parts where the solder balls 5 and the sealing resin layer 6b do not touch each other, are formed. As illustrated in FIG. 5C, the module 1 can be mounted on a mother substrate 12 by using the parts of the solder balls 5 that are exposed from the surface 60b as solder bumps as they are.

Therefore, according to the above-described embodiment, the external connection terminals of the module 1 are each formed of one solder ball 5 and therefore do not have a constricted shape and the reliability and mechanical strength can be improved. Furthermore, as a result of the solder balls 5 being used as external connection terminals, high positional accuracy can be realized for the external connection terminals due to a self-alignment effect that occurs when the heat treatment is performed in a reflow furnace. In addition, since part of each solder ball 5 is exposed from the surface 60b of the sealing resin layer 6b and the exposed parts of the solder balls 5 protrude from the surface 60b of the sealing resin layer, the solder balls 5 can be used as external connection terminals without necessarily performing plating. In addition, compared with the case where metal pins are used as the external connection terminals, since a plating treatment is not necessary, abnormal precipitation of plating resulting from grinding residue from when the surface 60b of the sealing resin layer 6b is subjected to grinding does not occur. Furthermore, due to the presence of the gaps 9 between the solder balls 5 and the sealing resin layer 6b, stress arising from a difference in thermal expansion coefficient between the solder and the resin can be reduced and the occurrence of cracks in the solder balls 5 can be suppressed.

In addition, by grinding the surface 60b of the sealing resin layer 6b until the component 4 is exposed, a low profile can be realized for the module 1.

Furthermore, the surface 60b of the sealing resin layer 6b is subjected to grinding until the solder balls 5 are exposed and then flux is applied to the exposed surfaces 5a of the solder balls 5 and a heat treatment is performed in a reflow furnace, and as a result the solder balls 5 come to have a substantially spherical shape and protrude from the surface 60b and the solder balls 5 can be used as they are as bumps when mounting the module on a mother substrate.

Figure 6:
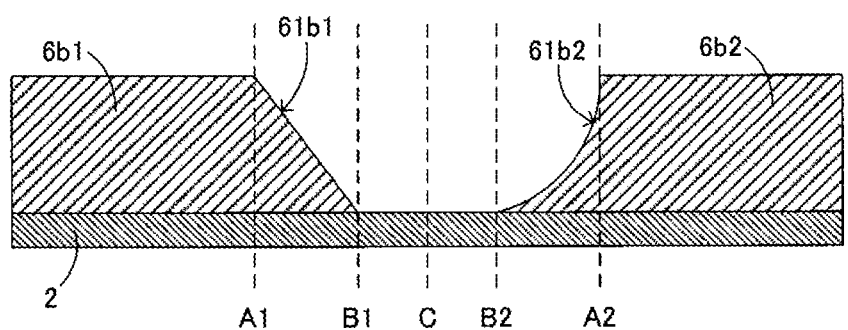
FIG. 6 is a diagram for describing the shape of a sealing resin layer around a solder ball.
Figure 7:
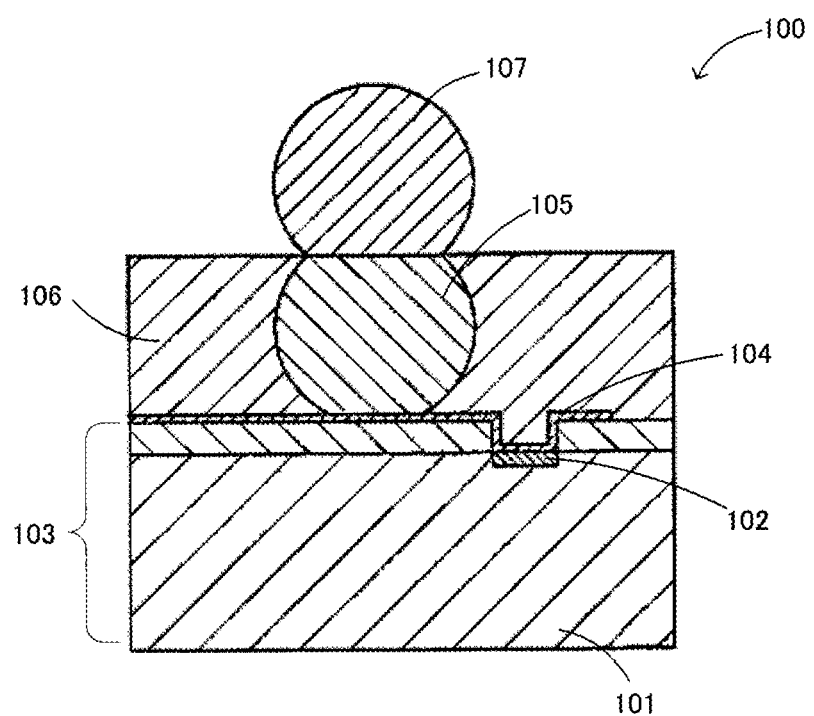
FIG. 7 is a diagram illustrating a module of the related art.

In addition, the load corresponding to stress acting in a horizontal direction in the substrate is dispersed as a result of the facing surfaces of the sealing resin layer that face the outer peripheral surfaces of the external connection terminals being curved surfaces that form curved lines in a cross section perpendicular to one main surface of the substrate compared with the case where the facing surfaces are curved surfaces that form straight lines in the cross section, and therefore the occurrence of peeling off can be suppressed. As illustrated in FIG. 6, in the case where a facing surface 61b1 forms a straight line in the cross section, the cross sectional area of a sealing resin layer 6b1 between A1 and B1 decreases linearly and the cross sectional area of the sealing resin layer 6b1 between B1 and C does not decrease. Here, the rate of decrease of the cross sectional area suddenly changes at the boundary B1, and therefore the load is concentrated at B1 and the sealing resin layer 6b1 is liable to peel from the substrate 2 in the case where stress acts in the horizontal direction of the module 1. On the other hand, in the case where a facing surface 61b2 forms a curved line in the cross section as in the above-described embodiment, the cross-sectional area of the sealing resin layer 6b2 does not decrease linearly between A2 and B2 and the rate of decrease of the cross-sectional area gradually becomes smaller from A2 to B2 and therefore there is no sudden change in the rate of decrease of the cross-sectional area at B2. Therefore, a situation in which the load becomes concentrated at B2 can be avoided and the occurrence of peeling off of the sealing resin layer 6b2 from the substrate 2 can be suppressed.

The present disclosure is not limited to the above-described embodiment and can be modified in various ways not described above so long as they do not depart from the gist of the disclosure.

INDUSTRIAL APPLICABILITY

In addition, the present disclosure can be applied to a variety of modules.

REFERENCE SIGNS LIST 1 module
2 substrate
3 component (first component)
4 component (second component)
5 solder ball (external connection terminal)
6a, 6b sealing resin layer
61b facing surface
8 connection electrode claims

The invention claimed is:

1. A module comprising:
a substrate;
a connection electrode that is provided on one main surface of the substrate;
a first component that is mounted on the one main surface of the substrate;
an external connection terminal comprising a solder ball disposed on the one main surface of the substrate with the connection electrode interposed between the solder ball and the substrate; and
a sealing resin layer that is provided on the one main surface of the substrate and seals the one main surface of the substrate and the first component;
wherein part of the external connection terminal is exposed from a surface of the sealing resin layer that is opposite from a surface of the sealing resin layer facing the one main surface of the substrate,
a height of the external connection terminal from the one main surface of the substrate is larger than a height of the sealing resin layer from the one main surface of the substrate,
there is a gap between the external connection terminal and the sealing resin layer,
a surface of the sealing resin layer, which faces and surrounds the external connection terminal, is shaped as a part of a substantially spherical body cut away from the sealing resin layer and has a circular line in a cross section perpendicular to the one main surface of the substrate, and
wherein the external connection terminal has a substantially spherical shape and does not have a constricted shape.

2. The module according to claim 1,
wherein the external connection terminal comprises one solder ball.

3. The module according to claim 1,
wherein the external connection terminal is not in direct contact with the sealing resin layer.

4. The module according to claim 1,
wherein part of the first component is exposed from the surface of the sealing resin layer that is opposite from the surface of the sealing resin layer facing the one main surface of the substrate.

5. The module according to claim 4,
wherein a surface of the first component that is exposed from the surface of the sealing resin layer opposite from the surface of the sealing resin layer facing the one main surface of the substrate is flush with the surface of the sealing resin layer opposite from the surface of the sealing resin layer facing the one main surface of the substrate.

6. The module according to claim 1,
wherein a second component is mounted on another main surface of the substrate.

7. A method of manufacturing a module, the method comprising:
a step of mounting a component and a solder ball on each of mounting electrodes, respectively, on one main surface of a substrate;
a step of heating the substrate in a reflow furnace and fixing the component and the solder ball to the substrate;
a step of providing a sealing resin layer that seals the substrate, the component, and the solder ball on the one main surface of the substrate;
a step of performing grinding on at least part of the solder ball and a surface of the sealing resin layer that is opposite from a surface of the sealing resin layer that faces the one main surface of the substrate so that the solder ball is exposed from the surface of the sealing resin layer that is opposite from the surface of the sealing resin layer facing the one main surface of the substrate; and
a step of reheating the substrate in a reflow furnace so that a height of the solder ball from the one main surface of the substrate becomes larger than a height of the sealing resin layer from the one main surface of the substrate.

8. The module according to claim 2,
wherein the external connection terminal is not in direct contact with the sealing resin layer.

9. The module according to claim 2,
wherein part of the first component is exposed from the surface of the sealing resin layer that is opposite from the surface of the sealing resin layer facing the one main surface of the substrate.

10. The module according to claim 3,
wherein part of the first component is exposed from the surface of the sealing resin layer that is opposite from the surface of the sealing resin layer facing the one main surface of the substrate.

11. The module according to claim 2,
wherein a second component is mounted on another main surface of the substrate.

12. The module according to claim 3,
wherein a second component is mounted on another main surface of the substrate.

13. The module according to claim 4,
wherein a second component is mounted on another main surface of the substrate.

14. The module according to claim 5,
wherein a second component is mounted on another main surface of the substrate.

* * * * *

UNITED STATES PATENT AND TRADEMARK OFFICE
CERTIFICATE OF CORRECTION

PATENT NO. : 11,276,631 B2
APPLICATION NO. : 16/716647
DATED : March 15, 2022
INVENTOR(S) : Matsukawa et al.

It is certified that error appears in the above-identified patent and that said Letters Patent is hereby corrected as shown below:

In the Specification

Column 7, Line 53, "8 connection electrode claims" should be -- 8 connection electrode --.

Signed and Sealed this
Seventh Day of February, 2023

Katherine Kelly Vidal
*Director of the United States Patent and Trademark Office*